United States Patent
Avanzino et al.

(10) Patent No.: US 6,469,385 B1
(45) Date of Patent: Oct. 22, 2002

(54) INTEGRATED CIRCUIT WITH DIELECTRIC DIFFUSION BARRIER LAYER FORMED BETWEEN INTERCONNECTS AND INTERLAYER DIELECTRIC LAYERS

(75) Inventors: Steven C. Avanzino, Cupertino; Pin-Chin Connie Wang, Menlo Park; Minh Van Ngo, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/874,175

(22) Filed: Jun. 4, 2001

(51) Int. Cl.[7] ............................................. H01L 23/522
(52) U.S. Cl. ....................... 257/741; 257/750; 257/752; 257/762
(58) Field of Search ................................ 257/741, 750, 257/752, 762, 758, 759

(56) References Cited

U.S. PATENT DOCUMENTS 5,818,071 A * 10/1998 Loboda et al. ................. 257/77
6,147,009 A * 11/2000 Grill et al. ..................... 438/780
6,294,832 B1 * 9/2001 Yeh et al. ...................... 257/751
6,342,733 B1 * 1/2002 Hu et al. ........................ 257/750
2001/0004550 A1 * 6/2001 Passemard .................... 438/618

FOREIGN PATENT DOCUMENTS

WO    WO 01/20665 A1 * 3/2001 ......... H01L/21/768

OTHER PUBLICATIONS

C.-F. Yeh et al., "O2-Plasma Degradation of Low-K Organic Dielectric and Its Effective Solution for Damascene Trenches," 5th International Symposium on Plasma-Induced Damage, May 2000, Santa Clara, CA, pp. 81-84.*

* cited by examiner

Primary Examiner—Olik Chaudhuri
Assistant Examiner—Stephen W. Smoot
(74) Attorney, Agent, or Firm—Mikio Ishimaru

(57) ABSTRACT

An integrated circuit and manufacturing method therefor is provided having a semiconductor substrate with a semiconductor device. A dielectric layer formed over the semiconductor substrate has an opening provided therein. The dielectric layer is of non-barrier dielectric material capable of being changed into a barrier dielectric material. The dielectric layer around the opening is changed into the barrier dielectric material and the conductor core material is deposited to fill the opening. The conductor core is processed to form a channel for the integrated circuit.

8 Claims, 2 Drawing Sheets

INTEGRATED CIRCUIT WITH DIELECTRIC DIFFUSION BARRIER LAYER FORMED BETWEEN INTERCONNECTS AND INTERLAYER DIELECTRIC LAYERS

TECHNICAL FIELD

The present invention relates generally to semiconductor technology and more specifically to forming a silicon carbide like diffusion barrier layer in integrated circuit interconnects.

BACKGROUND ART

In the manufacture of integrated circuits, after the individual devices such as the transistors have been fabricated in and on a semiconductor substrate or wafer, they must be connected, or "wired", together to perform the desired circuit functions. This interconnection process is generally called "metallization" and is performed using a number of different photolithographic, deposition, and removal processes to create contacts to the transistors, wire/channels to the contacts, and vias interconnecting the channels where there are more than one level of channels.

There are a number of different metallization techniques, but generally, a device dielectric layer is deposited over the transistors, openings are formed through the device dielectric layer down to transistor junctions and gates, and the openings are filled with a conductive metal to form contacts.

In one technique called the "single damascene" or "single inlaid" process, the formation of the first channels starts with the deposition of a thin first channel stop layer on the device dielectric layer. The first channel stop layer is an etch stop layer which is subject to a photolithographic processing step which involves deposition, patterning, exposure, and development of a photoresist, and an anisotropic etching step through the patterned photoresist to provide openings to the contacts. The photoresist is then stripped.

A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched. The first channel dielectric layer is then subject to further photolithographic process and etching steps to form first channel openings in the pattern of the first channels. The photoresist is then stripped.

An optional thin adhesion layer is deposited on the first channel dielectric layer over the entire semiconductor wafer and lines the first channel openings to ensure good adhesion of subsequently deposited material to the first channel dielectric layer. The adhesion layer is a metal such as tungsten (W), titanium (Ti), or tantalum (Ta).

High conductivity metals, such as copper (Cu), diffuse easily through dielectric materials such as silicon oxide and silicon nitride. This diffusion can result in a conductive buildup and cause short circuits in the integrated circuits. To prevent diffusion, a diffusion barrier is deposited on the adhesion layer. For copper conductor materials, the diffusion barrier layer is composed of materials such as tantalum nitride (TaN), titanium nitride (TiN), or tungsten nitride (WN).

However, these nitride compounds have relatively poor adhesion to copper and relatively high electrical resistance so they are problematic. For simplicity, the adhesion and barrier layers are sometimes collectively referred to as a "barrier" layer herein.

For conductor materials, such as copper and copper alloys, which are deposited by electroplating, a seed layer is deposited on the barrier layer and lines the barrier layer in the first channel openings to act as an electrode for the electroplating process. Processes such as electroless, physical vapor, and chemical vapor deposition are used to deposit the seed layer.

A first conductor material is electroplated on the seed layer and fills the first channel opening. The first conductor material and the seed layer generally become integral, and are often collectively referred to as the conductor core when discussing the main current-carrying portion of the channels.

A chemical-mechanical polishing/planarization (CMP) process is then used to remove the first conductor material, the seed layer, and the barrier layer above the first channel dielectric layer so the materials and layers are coplanar with the dielectric layer. The CMP process leaves the first conductor "inlaid" in the first channels dielectric layer to form the first channels. When a thin dielectric layer is placed over the first channels as a final layer, it is called a "capping" layer and the single damascene process is completed. When the layer is processed further for placement of additional channels over it, the layer is a via stop layer.

In another technique called the "dual damascene" or "dual inlaid" process, vias and channels are formed at the same time, generally over a completed single damascene process series of first channels. Effectively, two levels of channels of conductor materials in vertically separated planes are separated by an interlayer dielectric (ILD) layer and interconnected by the vias.

The initial step of the dual damascene process starts with the deposition of a thin via stop layer over the first channels and the first channel dielectric layer if it has not already been deposited as a capping layer. The via stop layer is an etch stop layer which is subject to photolithographic processing using a photoresist and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process using a photoresist and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, a seed layer is deposited on the barrier layer and lines the barrier layer in the second channel openings and the vias.

A second conductor material is electroplated on the seed layer and fills the second channel openings and the vias.

A CMP process is then used to remove the second conductor material, the seed layer, and the barrier layer above the second channel dielectric layer to form the second channels. When a layer is placed over the second channels as a final layer, it is called a "capping" layer and the dual damascene process is completed.

The layer may be processed further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process for conductor metals such as aluminum. The elimination of metal etch steps is important as the semiconductor industry moves from aluminum (Al) to other metallization materials, such as copper, which are very difficult to etch.

A major problem occurs at the interconnection of the channels with the vias. Barrier layers are required since the dielectric materials currently used in integrated circuits generally have no diffusion barrier properties and as a result allow conductive materials to diffuse through them and cause short circuits. The barrier layer has the drawback that it is deposited over the first channel in the via and prevents interconnect diffusion, especially with copper. When current flow through the via causes electro-migration of copper from the via, the copper is not made up from the first channel and this leads to voids in the via, which can lead to increased circuit resistance and open circuits.

Solutions to these problems have been long sought but have long eluded those skilled in the art.

DISCLOSURE OF THE INVENTION

An integrated circuit and manufacturing method therefor is provided having a semiconductor substrate with a semiconductor device. A dielectric layer formed over the semiconductor substrate has an opening provided therein. The dielectric layer is of non-barrier dielectric material capable of being changed into a barrier dielectric material. The dielectric layer around the opening is changed into the barrier dielectric material and the conductor core material is deposited to fill the opening. The conductor core is processed to form a channel for the integrated circuit. This allows a selective conversion of dielectric materials with no diffusion barrier properties to be converted into good barrier materials which allows larger channels and shrinkage of the integrated circuit.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
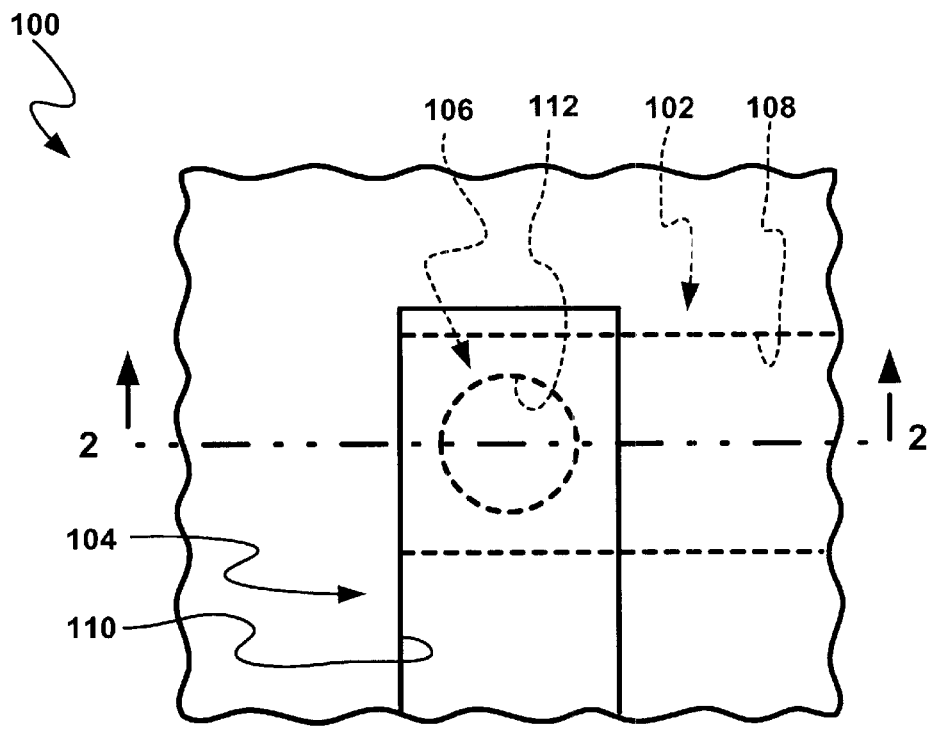
FIG. 1 (PRIOR ART) is a plan view of aligned channels with a connecting via.

Referring now to FIG. 1 (PRIOR ART), therein is shown a plan view of a semiconductor wafer 100 including a silicon semiconductor substrate (not shown) having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side"(as in "sidewall"), "higher", "lower", "over", and "under", are defined with respect to the horizontal plane.

Figure 2:
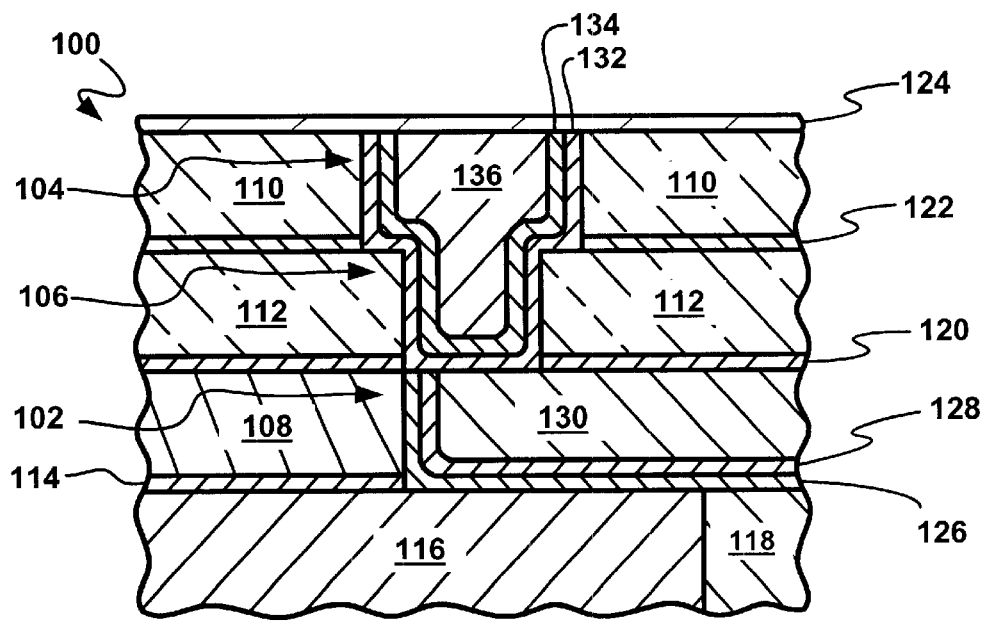
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116, which is on the silicon semiconductor substrate. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a capping or via stop layer 124.

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor material of the conductor cores 130 and 136 is deposited. The seed layers 128 and 134 are of substantially the same conductor material as the conductor cores 130 and 136 and become part of the respective conductor cores 130 and 136 after the deposition.

The major problem occurs at the interconnection of the channels with the vias. Barrier layers are required since the dielectric materials currently used in integrated circuits generally have no diffusion barrier properties and as a result allow conductive materials to diffuse through them and cause short circuits. The barrier layer has the drawback that it is deposited over the first channel in the via and prevents interconnect diffusion, especially with copper. When current flow through the via causes electro-migration of copper from the via, the copper is not made up from the first channel and this leads to voids in the via, which can lead to increased circuit resistance and open circuits.

Figure 3:
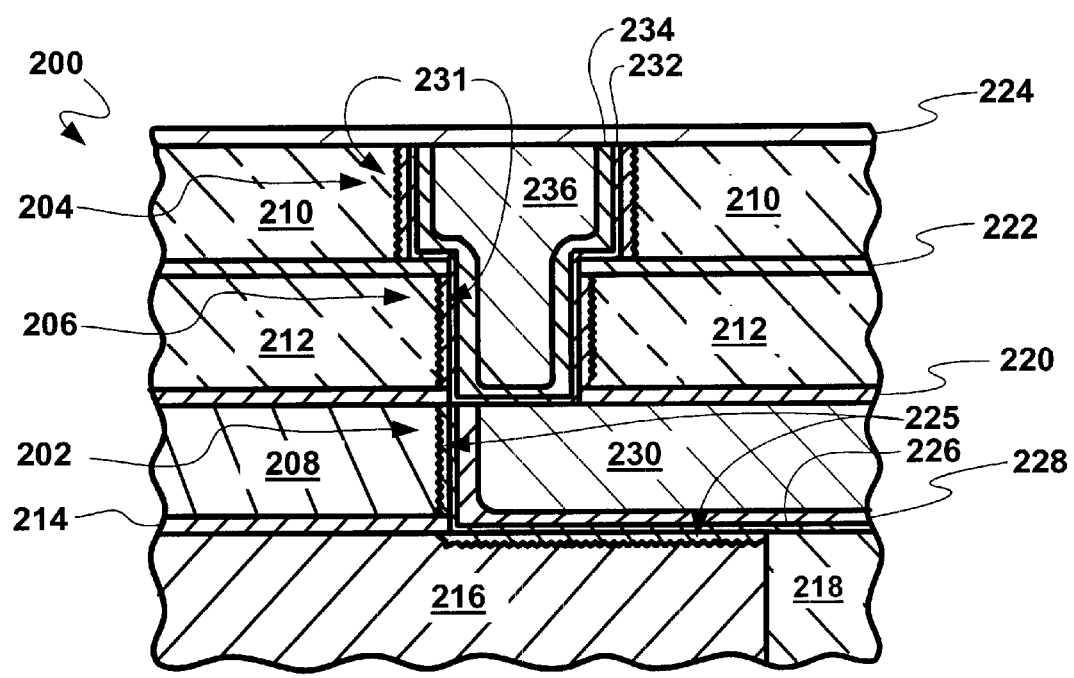
FIG. 3 is a cross-section of a semiconductor wafer similar to that shown in FIG. 2 (PRIOR ART) in accordance with the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second channel dielectric layers 208 and 210. The via 206 is a part of the second channel 204 and is disposed in a via dielectric layer 212.

In the present invention, the first channel, second channel, and via dielectric layers 208, 210, and 212 are of the dielectric a polymeric alkyl siloxane (SiCOM). SiCOH in particular has no significant diffusion barrier properties. Other dielectric materials which could be used include any methyl or alkyl siloxane polymeric dielectric, whether applied by chemical vapor deposition (CVD) or spin-on techniques.

A portion of the first channel 202 is disposed in a first channel stop layer 214 and is on a device dielectric layer 216. Generally, metal contacts (not shown) are formed in the device dielectric layer 216 to connect to an operative semiconductor device (not shown). This is represented by the contact of the first channel 202 with a semiconductor device gate 218 embedded in the device dielectric layer 216. The various layers above the device dielectric layer 216 are sequentially: the first channel stop layer 214, the first channel dielectric layer 208, a via stop layer 220, the via dielectric layer 212, a second channel stop layer 222, the second channel dielectric layer 210, and a next channel stop layer 224.

Around the first channel 202 is a region of barrier polymeric silicon carbide (SiC(H)) material 225, which is known to have good diffusion barrier properties, in the non-barrier SiCOH material. The first channel 202 is made up of a first seed layer 228 around a first conductor core 230. The second channel 204 and the via 206 are surrounded by a second region of barrier SiC(H) material 231 in the non-barrier SiCOH material. The second channel 204 includes a second seed layer 234 around a second conductor core 236.

The barrier SiC(H) material 225 is formed in the device dielectric layer 216 and the first channel dielectric layer 208. The barrier SiC(H) material 231 is formed in the via dielectric layer 212 and the second channel dielectric layer 210.

As an option to assist in the change, disposed between the barrier SiC(H) material 225 and the first seed layer 228 may be an atomic layer thickness of an oxygen-gettering material 226, such as tantalum, titanium, or aluminum, which may be either in elemental or oxidized form. Also as an option, disposed between the barrier SiC(H) material 225 and a second seed layer 228 may be an atomic layer thickness of an oxygen-gettering material 232.

In the present invention, the structure of FIG. 3 is manufactured by forming the semiconductor wafer 200 with the device dielectric layer 216 and the semiconductor device gate 218. After depositing the first channel stop layer 214, the first channel dielectric layer 208 of SiCOH material is deposited. After depositing the SiCOH material, the first channel dielectric layer 208 is etched for the opening for the first channel 202.

The surfaces of the non-barrier SiCOH material, including the opening for the first channel 202, are then reacted with species that reduce the oxide bonds in the non-barrier SiCOH material to change it into the barrier SiC(H) material 225. Similarly, after deposition of the via dielectric layer 212, the second channel stop layer 222, the second channel dielectric layer 210 and etching the opening for the via 206 and the second channel 204, a reducing treatment of the non-barrier SiCOH material will change it into the barrier SiC(H) material 231.

The reducing species can be of several different types and several different methods may be used. For example, a plasma ambient containing a high-density activated atomic hydrogen will reduce the non-barrier SiCOH material. Similarly, $H_2$, and $NH_3$, or other hydrides may be used.

Optionally, it is possible to deposit a very thin layer, by a process such as atomic layer chemical vapor deposition (ALCVD) of an elemental metal such as tantalum, titanium, aluminum, and other metals which are very reactive to oxygen so as to form the oxygen-gettering layers 226 and 232. Upon thermal treatment, these metals would reduce the SiCOH to SiC(H). While some of these metals are known to be barrier materials, these barrier properties would be additive and the actual compounds formed would be their inert oxides due to the reaction with the oxygen in the SiCOH as it is reduced to SiC(H).

The seed layers (where used) are of materials such as copper (Cu), gold (Au), silver (Ag), compounds thereof and combinations thereof with one or more of the above elements. The conductor cores with or without seed layers are of conductor materials such as copper, aluminum (Al), gold, silver, compounds thereof, and combinations thereof.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. An integrated circuit comprising:
    a semiconductor substrate having a semiconductor device provided thereon;
    a dielectric layer of non-barrier dielectric material capable of being changed into a barrier dielectric material and having an opening provided therein, the dielectric layer over to the semiconductor substrate;
    a conductor core over the dielectric layer to fill the opening and connect to the semiconductor device; and
    a change assisting material between the dielectric layer and the conductor core.

2. The integrated circuit as claimed in claim 1 wherein the conductor core is of a material from a group consisting of copper, aluminum, gold, silver, a compound thereof, and a combination thereof.

3. The integrated circuit as claimed in claim 1 wherein the dielectric layer is of SiCOH as the non-barrier dielectric material.

4. The integrated circuit as claimed in claim 1 wherein the dielectric layer is of SiCOH as the non-barrier dielectric material and the dielectric layer is of SiC(H) as the barrier dielectric material.

5. An integrated circuit comprising:
- a semiconductor substrate having a semiconductor device provided thereon;
- a dielectric layer of non-barrier dielectric material capable of being reduced into a barrier dielectric material and having an opening provided therein, the dielectric layer over the semiconductor substrate;
- a seed layer over the dielectric layer to line the opening;
- a conductor core over the seed layer to fill the opening and connect to the semiconductor device;
- the conductor core and the seed layer planarized to form a channel; and
- an atomic layer of oxygen-gettering material between the dielectric layer and the seed layer.

6. The integrated as claimed in claim 5 wherein the seed layer and the conductor core are of a material from a group consisting of copper, aluminum, gold, silver, a compound thereof, and a combination thereof.

7. The integrated circuit as claimed in claim 5 wherein the dielectric layer is of SiCOH as the non-barrier dielectric material.

8. The integrated circuit as claimed in claim 5 wherein the dielectric layer is of SiCOH as the non-barrier dielectric material and the dielectric layer is of SiC(H) as the barrier dielectric material.

* * * * *

UNITED STATES PATENT AND TRADEMARK OFFICE
CERTIFICATE OF CORRECTION

PATENT NO. : 6,469,385 B1
DATED : October 22, 2002
INVENTOR(S) : Avanzino et al.

It is certified that error appears in the above-identified patent and that said Letters Patent is hereby corrected as shown below:

Column 2,
Line 25, delete "channels" and insert therefore -- channel --

Column 5,
Line 22, delete "a" and insert therefore -- material --

Column 6,
Line 63, delete "to"

Column 8,
Line 7, after "integrated" insert -- circuit --

Signed and Sealed this

Thirteenth Day of May, 2003

JAMES E. ROGAN
*Director of the United States Patent and Trademark Office*